United States Patent [19]

Bhattacharya et al.

[11] Patent Number: 4,863,810

[45] Date of Patent: Sep. 5, 1989

[54] CORROSION RESISTANT AMORPHOUS METALLIC COATINGS

[75] Inventors: Rabi S. Bhattacharya; Amarendra K. Rai; Peter P. Pronko, all of Dayton; Charbel Raffoul, Beavercreek, all of Ohio

[73] Assignee: Universal Energy Systems, Inc., Dayton, Ohio

[21] Appl. No.: 98,851

[22] Filed: Sep. 21, 1987

[51] Int. Cl.$^4$ .............................................. B32B 15/04
[52] U.S. Cl. .................... 428/661; 428/664; 428/678; 428/680; 148/403; 148/900; 148/903
[58] Field of Search ................ 427/38; 428/678, 679, 428/680, 660, 661, 668, 687, 664; 148/403, 900, 903, 902

[56] References Cited

U.S. PATENT DOCUMENTS

| | | | |
|---|---|---|---|
| 3,900,636 | 8/1975 | Curry et al. | 427/38 |
| 4,116,682 | 9/1978 | Polk et al. | 148/403 |
| 4,122,240 | 10/1978 | Banas et al. | 148/403 |
| 4,231,816 | 11/1980 | Cuomo et al. | 148/31.55 |
| 4,341,841 | 7/1982 | Ohno et al. | 428/414 |
| 4,351,695 | 9/1982 | Hieber et al. | 427/38 |
| 4,402,994 | 9/1983 | Kobuyashi et al. | 427/38 |
| 4,494,136 | 1/1985 | Perepezko | 357/67 |
| 4,496,635 | 1/1985 | Wang et al. | 428/680 |
| 4,515,869 | 5/1985 | Bose et al. | 428/680 |
| 4,521,800 | 6/1985 | Howe | 357/67 |
| 4,522,844 | 6/1985 | Khanna et al. | 427/38 |
| 4,526,624 | 7/1985 | Tombrello et al. | 148/1.5 |
| 4,555,186 | 11/1985 | Scruggs | 148/403 |
| 4,558,297 | 12/1985 | Shigeta et al. | 336/253 |
| 4,564,395 | 1/1986 | Mori et al. | 148/403 |
| 4,568,014 | 2/1986 | Madsen | 228/262.16 |
| 4,613,386 | 9/1986 | Yates | 148/13 |
| 4,623,906 | 11/1986 | Chandrashekhar et al. | 346/140 R |
| 4,626,448 | 12/1986 | Hays | 427/39 |
| 4,636,435 | 1/1987 | Yanagihara | 428/336 |
| 4,640,744 | 2/1987 | Howe | 204/1 R |
| 4,645,690 | 2/1987 | Murakami et al. | 427/128 |
| 4,692,305 | 9/1987 | Rangaswamy et al. | 148/403 |

FOREIGN PATENT DOCUMENTS

| | | | |
|---|---|---|---|
| 132907 | 2/1985 | European Pat. Off. | 148/403 |
| 134653 | 3/1985 | European Pat. Off. | 148/403 |
| 214153 | 10/1984 | German Democratic Rep. | 427/38 |
| 77586 | 5/1983 | Japan | 428/680 |

OTHER PUBLICATIONS

Bhattacharya et al., "Corrosion Behavior of rf-Sputtered $Ni_{45}Cr_{55}$ Film", Materials Letters 4, 271 (1986).
Bhattacharya et al., "Ion-Beam Mixing of Ni-Mo and of Ni-Ti Binary Systems", J. Appl. Phys. 58, 248 (1985).
Bhattacharya et al., "Corrosion Behavior of Amorphous TiNi Films Fabricated by Ion Beam Mixing", Materials Letters 2, 483 (1984).
Bhattacharya et al., "Corrosion Behavior of Amorphous Ni Based Alloy Coatings Fabricated by Ion Beam Mixing", J. Vac. Sci. Tech. A3, 2680 (1985).
N. Q. Lam et al., "Nonequilibrium Segregation and Phase Instability in Alloy Films During Elevated-Temperature Irradiation in a High-Voltage Electron Microscope", Effects of Radiation on Materials: 12th International Symposium, ASTM STP 870, American Society for Testing and Materials, Philadelphia, 1985, pp. 430-434.
M. W. Thompson, Defects and Radiation Damage in Metals, Cambridge University Press, 1969, pp. 122-126.
O. S. Oen, Solid State Division, "Cross Sections for Atomic Displacements in Solids by Fast Electrons", Aug. 1973, Oak Ridge National Laboratory, No. W-7405 Eng-26.

Primary Examiner—John J. Zimmerman
Attorney, Agent, or Firm—Michael Rechtin

[57] ABSTRACT

A method of providing corrosion resistant substrates having an amorphous metallic alloy coating thereon. The method comprises depositing refractory and transition elements, such as Ni, Nb, Ti and Cr, onto the substrate to provide a crystalline metallic layer thereon which is then irradiated to convert the layer into an amorphous metallic coating on the substrate. The coated substrate displays a corrosion resistance which is at least about four orders of magnitude greater than for the uncoated substrate in both 1N $HNO_3$ and 0.1 N NaCl aqueous solutions.

7 Claims, 5 Drawing Sheets

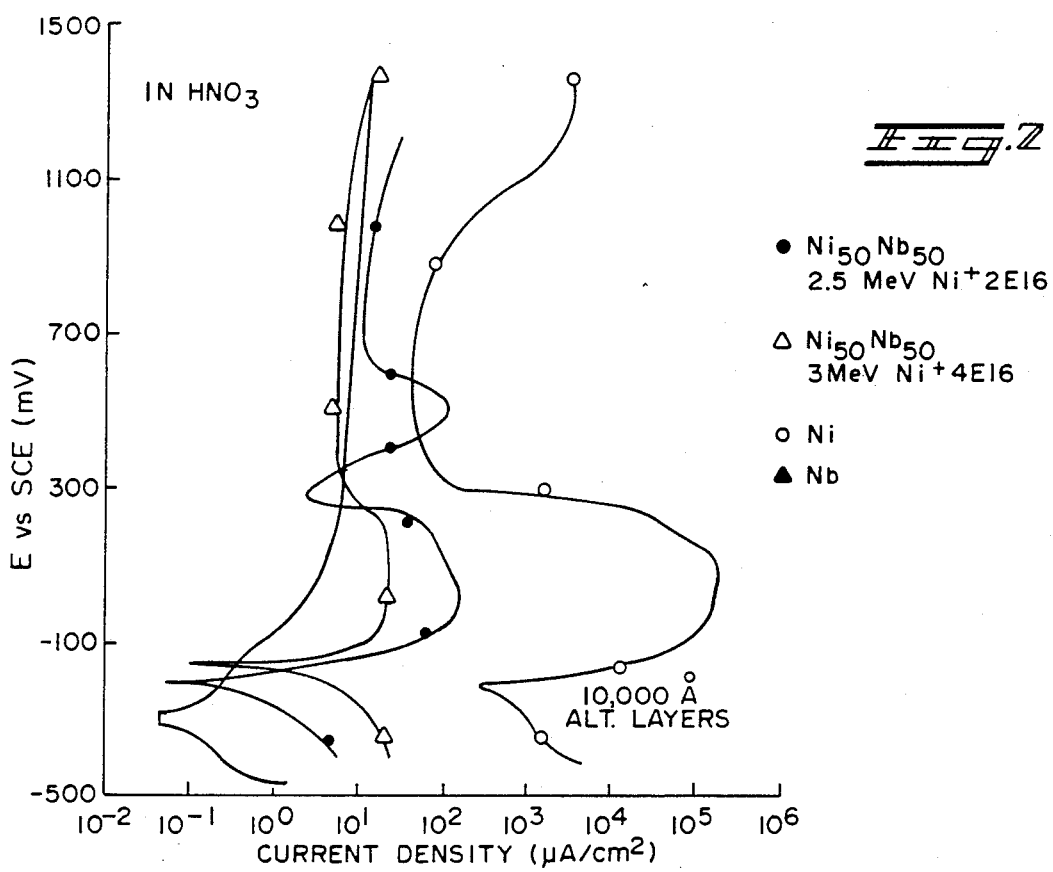
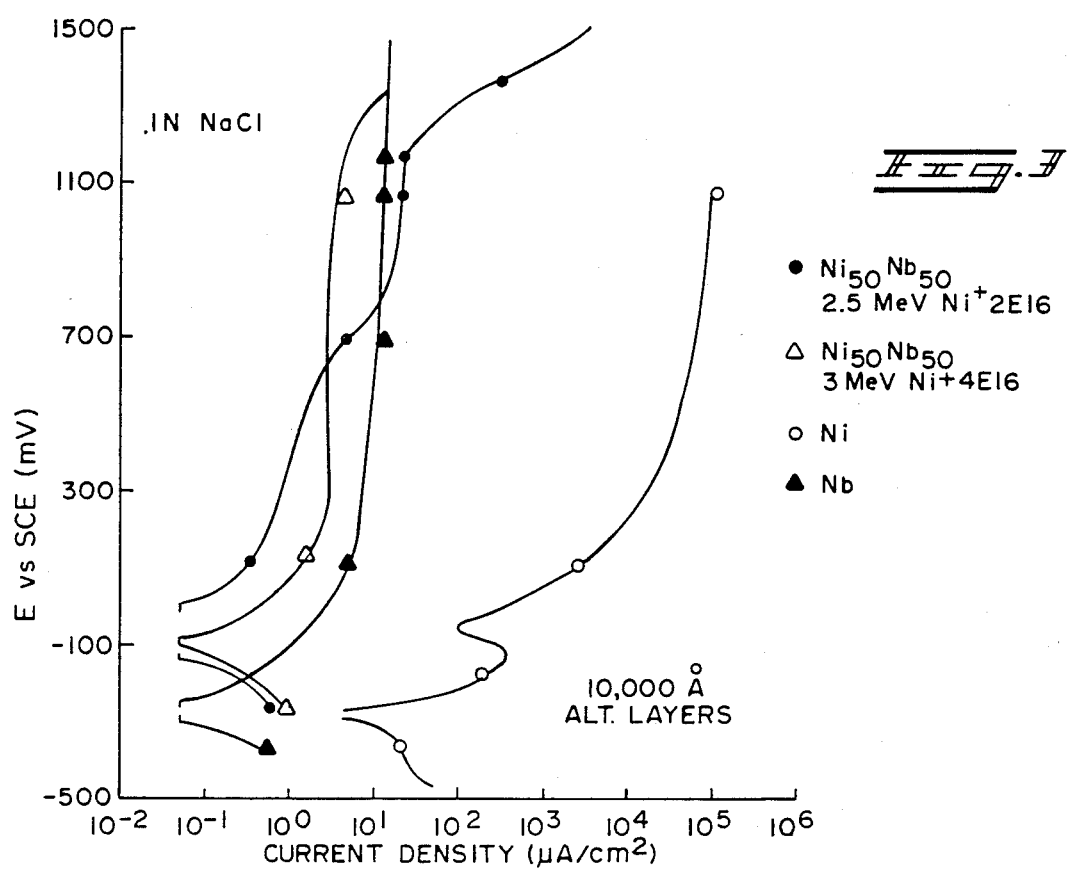

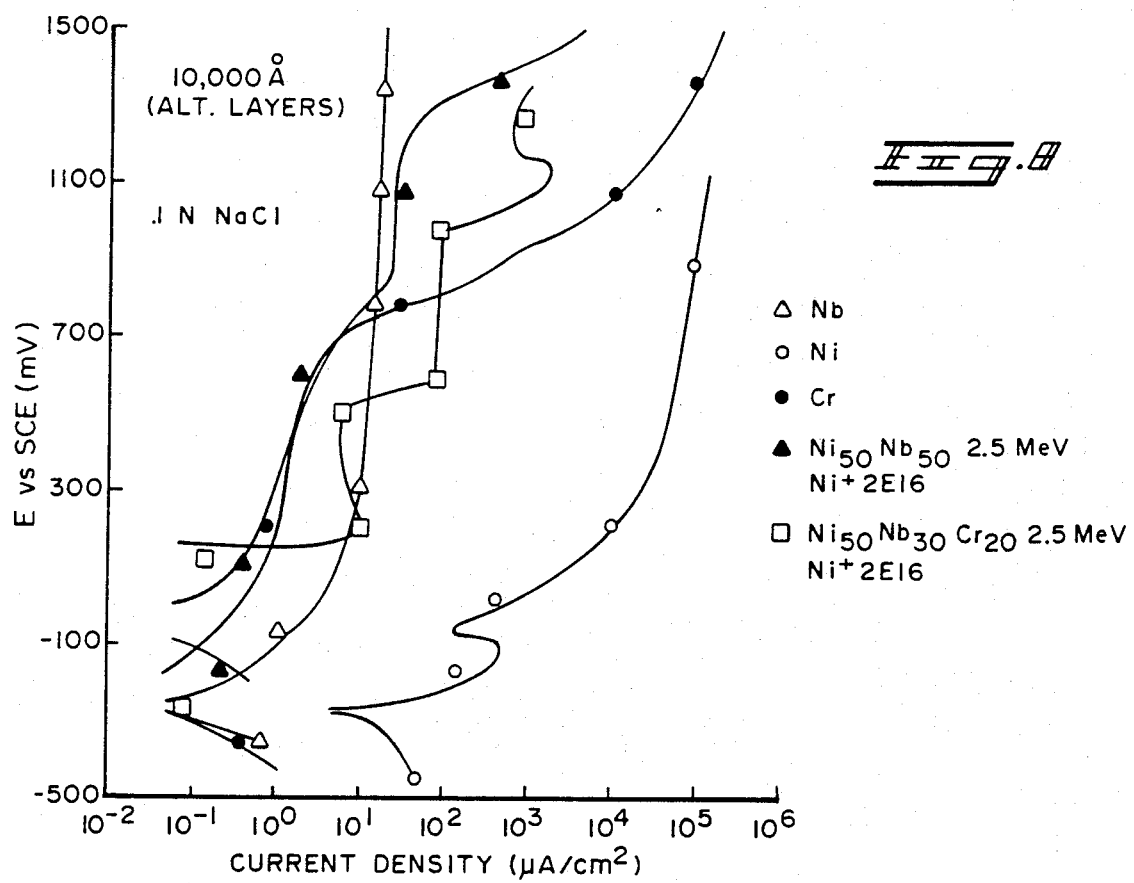

CORROSION RESISTANT AMORPHOUS METALLIC COATINGS

The present invention is generally directed to a method of producing an amorphous metallic coating by radiation damage and more particularly is related to producing a thoroughly amorphized metallic coating having an extremely small apparent grain size.

It is generally known that "amorphous" metal alloy coatings on metal substrates serve to protect the underlying substrate from corrosion. For example, it is known that "amorphous" alloys of MoNi and TiNi on metal substrates generally provide some improvement for the corrosion resistance of the underlying substrate. MoNi coatings have been made by electron beam evaporation of alternate layers of about one hundred Angstroms of Mo and seventy Angstroms of Ni onto a Ni substrate. After deposition the alternating layers of Mo and Ni were irradiated with ions to produce "amorphous" MoNi (that is some degree of non crystallinity for the MoNi). Similarly, "amorphous" coatings of NiTi were made by alternately depositing crystalline layers of eighty Angstroms of Ti and fifty Angstroms of Ni and then irradiating the layers with ions. The corrosion resistance of the coated substrates have been evaluated by use of potentiodynamic polarization measurements. The results indicated that polycrystalline alloy substrates bearing the amorphous coatings had improved corrosion resistance to nitric acid solutions relative to the alloy substrate per se.

"Amorphous" films of TiNi, FeNiCrW, CrB, ZrCu and TiCu have been produced in the prior art by ion beam implantation of metallic layers produced by rf sputtering or electron beam deposition onto Ni substrates. Substrates bearing the TiNi coatings showed improved corrosion resistance to nitric acid. NiCr coatings have also been made by rf sputtering of a NiCr alloy target onto Ni and Si substrates followed by at least partial amorphization of the NiCr layer. The NiCr alloy coatings improved the corrosion resistance in acids, but performed relatively poorly in Cl ion containing solutions.

Although the prior art has produced "amorphous" nickel based alloys which show somewhat improved corrosion resistance relative to crystalline alloys, the level of improvement has been modest. In some cases, the prior art has not been able to achieve levels of corrosion resistance which are satisfactory in both acidic, basic and neutral pH solutions.

It is therefore an object of the invention to provide amorphous metallic alloy coatings over substrates which show substantially improved corrosion resistance when subjected to any one of various types of aqueous solutions.

It is another object of the invention to provide transition metal/refractory metal alloy compositions which form a thoroughly amorphous phase upon ion beam implantation induced atom displacements in the alloy.

It is an additional object of the invention to provide a method of producing metallic coatings having a thoroughly amorphous atomic arrangement obtained by ion beam implantation with the resulting amorphous coating having greatly improved corrosion resistance over partially amorphized coatings.

The invention is directed generally to a method of producing amorphous, metallic alloy coatings on a substrate. Selected refractory and transition metal elements such as Ni, Nb, Ti and Cr are deposited onto the substrate to provide a starting composite crystalline metallic layer thereon. The crystalline metallic layer is then irradiated with ions to convert the composite layer into a thoroughly amorphized metallic coating on the substrate. The ion beam irradiation is continued until the apparent grain size of the amorphous coating is at least less than about one hundred Angstroms. Typical ions used for irradiation include, for example, Ni+, Au+ and Pt+ at energy levels of about 100 Kev to 4 MeV. Other types of radiation may however be used in place of energetic elemental ion beams, such as, fast neutrons, high energy electrons, molecular beams and high energy photons in some cases. The implanted ion concentration and ion energy used during the amorphization process can be varied to achieve about 15–130 atomic displacements per atom within the deposited, crystalline metallic layer. The substrates bearing the amorphous alloy coatings show an improved corrosion resistance to basic, acidic and neutral aqueous solutions. Amorphous alloy coatings which have been found to provide improved corrosion resistance include, for example, alloys of Ni and Nb, where Ni is from 40% to 60%; alloys of Ni and Ti where Ni is from 40%–60%; and alloys of NiNbCr where Ni is from 40%–60%, Nb is 10% to 30% and Cr comprises the balance.

Further objects and advantages of the present invention, together with the organization and method of accomplishing the invention will become apparent from the following detailed description when taken in conjunction with the accompanying drawings.

Brief Description Of The Drawings

FIG. 2 shows potentiodynamic polarization curves for pure Ni, Nb and an amorphous $Ni_{50}Nb_{50}$ coating on a Ni substrate in a 1N $HNO_3$ solution;

FIG. 3 shows potentiodynamic polarization curves for pure Ni, Nb and amorphous $Ni_{50}Nb_{50}$ coating on a Ni substrate in a 0.1N NaCl solution;

FIG. 8 shows potentiodynamic polarization curves for a 0.1N NaCl solution for Ni, an amorphous $Ni_{50}Nb_{50}$ coating and an amorphous $Ni_{50}Nb_{30}Cr_{20}$ coating on a Ni substrate.

DETAILED DESCRIPTION OF THE PREFERRED EMBODIMENTS

Figure 1:
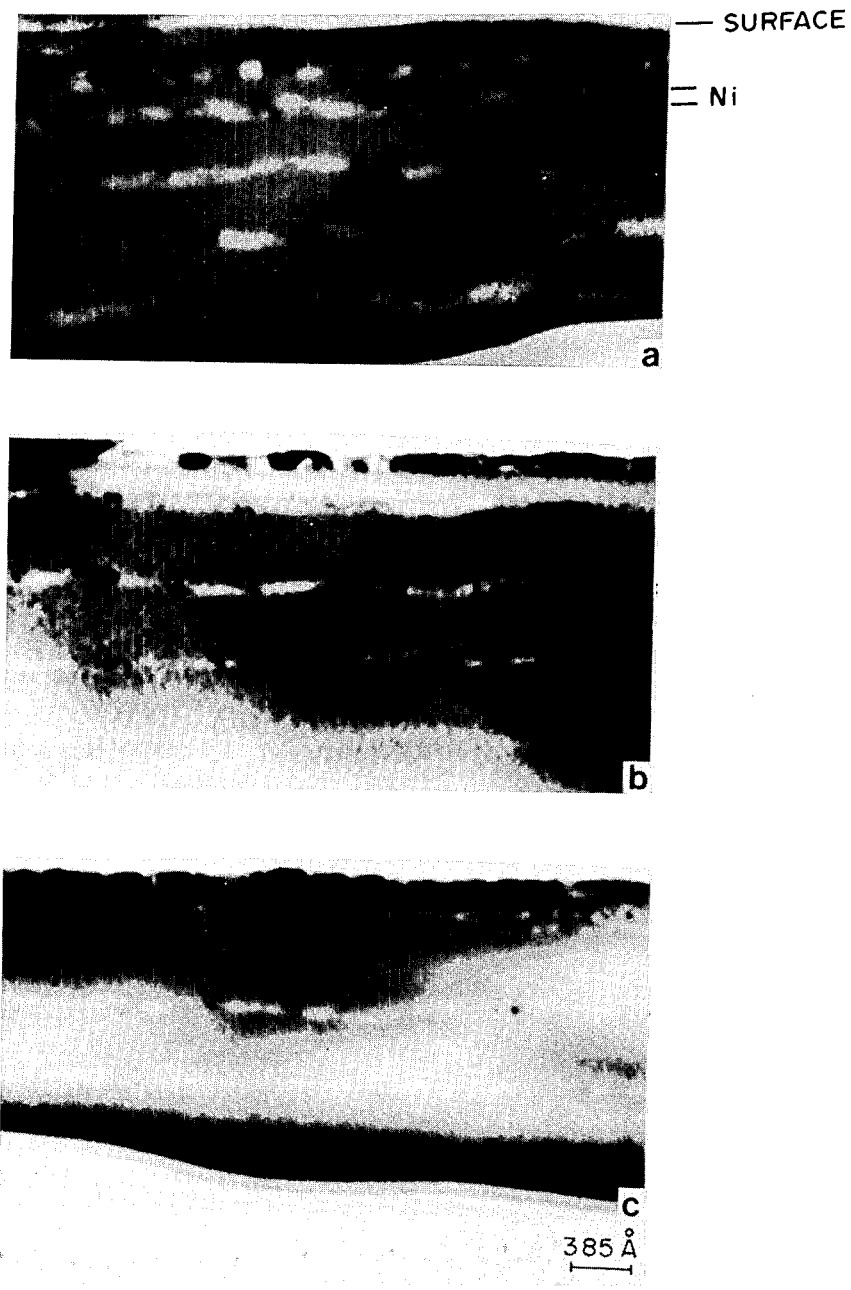
FIGS. 1A–C are transmission electron micrographs of a NiNb film in cross section after the NiNb has been irradiated with 2.5 MeV Ni+ ions at various radiation damage levels.

The invention is directed to a method for producing an amorphous metallic coating on a substrate and also directed to an amorphous metallic composition of matter. The method involves initially depositing various metals on a substrate to provide a starting material comprising a crystalline metallic layer. This crystalline metallic layer is irradiated with ions to convert it into an amorphous metallic coating on the substrate. Metals which can be deposited to form the metallic layer include, for example, transition metals and refractory metals, such as Ni, Nb, Ti, W and Cr. Ions used to irradiate the metallic layer include, for example, Ni+, Au+, and Pt+, at energy levels of about 100 KeV to 4 MeV and at concentrations of about $1 \times 10^{16}$ to $4 \times 10^{16}/cm^2$. The associated number of displacements per atom in the metallic layer can be determined in a conventional manner. For example, 1 MeV Ni+ implanted to a concentration of $1 \times 10^{16}/cm^2$, yields a number of displacements per atom ranging from about twelve at the surface and continuing at this level over several thousand Angstroms to a peak at the end of the ion range. A maximum of about twenty-five displacements per atom occurs at the depth of the peak of the damage curve.

Various types of corrosion resistant amorphous alloys, particularly transition metal/refractory metal alloys, can be generated in accordance with the invention. Exemplary amorphous alloy coatings which have been found to provide substantially improved corrosion resistance include Ni-Nb alloys of 40%-60% Ni and 60%-40% Nb; Ni-Ti alloys of 40%-60% Ni and 60%-40% Ti; Ni-Nb-Cr alloys of 40%-60% Ni, 10%-30% Cr and 10%-50% Nb; and Ni-Cr-Ti alloys of 40%-60% Ni, 10%-30% Cr and 10%-50% Ti. The substrates underlying the amorphous alloy coatings show substantially improved corrosion resistance to a range of neutral, acidic and basic pH aqueous solutions.

In accordance with the preferred embodiment, the substrate preferably is a metal. The substrate is prepared by polishing the surface to a mirror finish (600 grit alumina followed by one micron alumina) and ultrasonically cleaning in trichloroethylene and acetone, followed by rinsing with deionized water. After the substrate has been prepared, various metallic elements such as Ni, Nb, Ti and Cr are deposited to provide a metallic layer of the selected elements. Preferably, the metallic layer is a composite formed by deposition of alternate layers of each alloying element in sufficient relative thickness and number to yield the desired chemical composition in the final product composite layer. The metal constituents can be deposited in a known manner, such as, by evaporation, sputtering, ion plating or electroplating. Other types of deposition techniques can also be used to form the composite metallic coating in a manner which can be appreciated by those skilled in the art.

Amorphous alloy films of, for example, NiTi can be produced by depositing alternate layers of Ni and Ti onto a substrate, such as Ni or Si, to thereby provide a composite metallic layer on the substrate. Typically, Ni+, Pt+ and Au+ ions having energies in the range of 100 KeV to 4 MeV are employed to irradiate the starting metallic layer to produce an amorphous NiTi coating. The average displacements per atom in the NiTi required to produce a thoroughly amorphous film can be varied in accordance with the thickness of the deposited metallic layer, the constituents and structure of the deposited layer and the parameters which characterize the ion beam, including ion mass and energy. In this regard, formation of the amorphous coating relates to the depth of penetration of the ions into the composite layer and the resulting atomic displacements per atom (hereinafter, "dpa") in the composite layer. Preferably, about 15-30 dpa are used to effect amorphization.

The level of dpa required to effect amorphization of the deposited layer has also been found to depend on the manner in which the layer is initially deposited. In this respect, a layer which is formed by simultaneously co-depositing a plurality of metal components tends to require lower overall dpa values to bring about thorough amorphization, as compared to a composite layer formed by deposition of a number of alternate layers of the constituent metallic components. For example, a thoroughly amorphous NiNb film can be achieved at roughly one fourth to approximately three fourths the dpa value for a co-deposited NiNb starting layer, as compared to a NiNb composite starting layer formed of alternate layers of Ni and Nb. Co-deposition can be performed by, for example, simultaneous evaporation of the various metal components of the desired amorphous alloy, rf sputtering of atoms from a target of the alloy, electroplating and ion plating. The specific radiation damage required to achieve thorough amorphization of the deposited layer will vary with the thickness and chemical characteristics of the alloy, including the chemical species and the structural morphology in the deposited layer which can be either crystalline or "amorphous," depending on deposition conditions.

The amorphous coatings obtained as a result of the above described ion beam implantation, or mixing, technique were evaluated for corrosion resistance in acidic, neutral or basic pH aqueous solutions by use of the conventional potentiodynamic polarization method. Details of this method can be found, for example, in Bhattacharya et al., "Corrosion Behavior of Amorphous Ni Based Alloy Coatings Fabricated by Ion Beam Mixing," J. Vac. Sci. Technol. A 3(6), Nov./Dec. 1985, which is incorporated by reference herein.

In accordance with the aforementioned potentiodynamic polarization method, after the plot of the corrosion parameter (Ecorr) against time has reached equilibrium, the surface of the coated substrate was subjected to an anodic potential scan at a rate of 1 mV/s. The scans started at the cathodic potential of about $-200$ mV for Ecorr and were continued until the potential reached about $+1500$ mV.

The invention will now be explained in more detail by reference to the following non-limiting examples.

Example 1

An amorphous $Ni_{50}Nb_{50}$ coating was formed by deposition of alternate layers of Ni and Nb onto a Ni substrate. The substrate had been previously prepared by polishing the substrate to a mirror finish (600 grit alumina followed by one micron alumina), ultrasonically cleaned in trichloroethylene and acetone, and rinsed in deionized water. Alternate layers of Ni of about 150 Angstroms and Nb of about 250 Angstroms were deposited by rf sputtering in a vacuum of about $10^{-6}$ torr to produce a composite $Ni_{50}Nb_{50}$ layer having a thickness of about one micron. The composite layer was then irradiated at room temperature with 2.5 MeV Ni+ ions to concentrations ranging from about $1 \times 10^{16}$ to about $4 \times 10^{16}/cm^2$.

FIGS. 1A, 1B and 1C show transmission electron micrographs of an as-deposited composite NiNb layer irradiated with 2.5 MeV Ni+ ions at concentrations of $1 \times 10^{16}$ (about 15-30 dpa), $2 \times 10^{16}$ (about 30-60 dpa) and $4 \times 10^{16}/cm^2$ (about 60-120 dpa), respectively. As shown in the cross-sectional electron transmission micrographs of FIG. 1, it is apparent that the extent of amorphization attained at a given ion energy increases as the concentration of implanted ions increases, that is, the amorphization increases as the dpa level increases.

Amorphization proceeds in stages wherein the apparent grain size in the deposited layer decreases as the extent of amorphization increases. The term "apparent" grain size is meant to infer there is an approximate size for coherent scattering regions of the coating, but there is no implication of any precise structural requirement of grain boundaries; nor is there any requirement for any particular intragranular atomic order associated with a well characterized crystalline phase.

The apparent Ni grain sizes perpendicular to the Ni layers of the composite NiNb structure remained substantially unchanged at about 150 Angstroms average diameter when irradiated to a relatively moderate 15-30 dpa level. At this same dpa level the average Nb grain size also remained substantially unchanged at less than about ten to forty Angstroms average diameter. This lack of substantial change in apparent grain size seems to indicate that amorphization of this particular deposited layer has not occurred to any appreciable extent at this relatively moderate damage level. However, as the implanted ion damage level increases to about 30-60 dpa ($2 \times 10^{16}/cm^2$ for 2.5 MeV Ni+) and 60-120 dpa, ($4 \times 10^{16}/cm^2$), the apparent grain size of the Ni grains decreased sharply to about eighty Angstroms and then to about sixty Angstroms, respectively, indicating an increasing degree of amorphization. At these higher implanted ion concentrations and associated damage levels, any large size Nb grains also decreased to the range of ten to fifteen Angstroms in diameter. However, as the apparent grain size decreased, it became increasingly more difficult to identify whether particular grains were Ni or Nb. Thoroughly amorphized NiNb was apparently achieved with damage levels of about 60-120 dpa, as determined by transmission electron diffraction showing diffuse amorphous scattering character and transmission microscopy showing very small apparent grain size.

The corrosion resistance of the amorphous alloy coating is believed to be highly dependent on the extent of amorphization since corrosion resistance undergoes substantial, non-linear improvement as the extent of amorphization increases. For example referring to FIG. 2, we can compare corrosion behavior of the deposited metallic coating of NiNb as a function of varying ion damage level. For a metallic NiNb coating which was not thoroughly amorphized by use of 2.5 MeV ions at a concentration of $2 \times 10^{16}/cm^2$ (about 30-60 dpa), the potentiodynamic curve showed a double dissolution peak. Compared to the behavior of Ni, the overall corrosion resistance was however lowered by a factor of about three orders of magnitude in the critical current density region from about $-100$ to $+300$ mV. The corrosion behavior however essentially merged with Ni from about $+400$ to $+600$ mV but from $+700$ to $+1100$ mV the corrosion behavior was a factor of about five to ten lower than Ni. For a thoroughly amorphized NiNb produced by irradiating with 3 MeV Ni+ to a concentration of $4 \times 10^{16} cm^2$ (about 65-130 dpa), the amorphized NiNb coating had an apparent grain size in the range of ten to eighty Angstroms and an average size of sixty Angstroms. Compared to the 30-60 dpa specimen (just described above) the corrosion resistance of the 65-130 dpa specimen improved by a factor of about five to ten over the critical current density range of $-100$ to $+250$ mV, and did not show the double dissolution curve present in the 30-60 dpa specimen. From $+400$ to $+1400$ mV the corrosion resistance is lower by a factor of about four to twenty times that of the 30-60 dpa specimen.

The improved corrosion resistance at the high dpa level is believed to be attributable to the more complete or thorough amorphization as manifested by the small apparent grain sizes produced by irradiation to these higher damage levels. The continued decrease of apparent grain size as the dpa level increases from the range of 30-65 to the range of 65-130 dpa is somewhat surprising; and this change results in substantial improvement in corrosion resistance even though the difference in structural percentage of amorphous material does not appear to change dramatically. The amount of radiation damage required to achieve thorough amorphization will of course vary with the thickness, the chemical characteristics and the atomic structure of the metallic coating.

The potentiodynamic polarization curves for Ni, Nb and various amorphous NiNb coatings on a Ni substrate in a 1N $HNO_3$ solution are shown in FIG. 2. The Ni specimen shows active dissolution from $-150$ to $+300$ mV followed by passivation from $+300$ to $+900$ mV. Amorphous NiNb formed by irradiation with 2.5 MeV Ni+ ions at a lower concentration of $2 \times 10^{16}/cm^2$ (about 30-60 dpa) had a critical current density which was about three orders of magnitude lower than that of Ni. Amorphous $Ni_{50}Nb_{50}$ formed by irradiation with 3 MeV Ni+ and implanted to concentrations of $4 \times 10^{16}/cm^2$ (about 60-125 dpa) attained a critical current density of 50 micro-amp/$cm^2$ which was over 4 orders of magnitude below that of Ni. Moreover, as indicated hereinbefore there was no double peak in the dissolution range for the critical current density of the $Ni_{50}Nb_{50}$ coating irradiated with ions at the higher level of damage.

FIG. 3 shows the potentiodynamic polarization behavior of Ni and of amorphous NiNb films on a Ni substrate in a corrosive medium of a 0.1N NaCl aqueous solution. Nickel did not show a well-defined active-passive transition, but rather exhibited a smooth rate of change in dissolution with a small passivation "nose" at $-100$ mV. In general, the amorphous NiNb coatings show lower corrosion rates and higher corrosion breakdown voltage potentials than Ni alone. An amorphous NiNb coating formed by use of 3 MeV Ni+ at a concentration of $4 \times 10^{16}/cm^2$ (about 60-125 dpa) showed a steady, low critical current density of 5 microamp/$cm^2$ over the voltage potential range of about $-100$ to $+1100$ mV. In contrast, the NiNb amorphous coating formed with lower energy 2.5 MeV Ni+ and implanted to a lower ion concentration of $2 \times 10^{16}/cm^2$ (about 30 to 60 dpa) showed a slight increase in current density at a voltage of about 700 mV. In addition, the breakdown voltage potential for the amorphous coating produced at the lower dpa value was also lower (1200 mV) than the coating amorphized at the higher dpa (1400 mV). It appears that the superior overall corrosion performance of the amorphous coatings is due to the greater degree of amorphization achieved in the high dpa treated layer. The amorphous coatings produced by implantation of 3 MeV Ni+ ions to a concentration of about $2 \times 10^{16}/cm^2$ (60-125 dpa) showed current densities which were at least four orders of magnitude less than for Ni in the first and second dissolution regions for $HNO_3$ and NaCl aqueous solutions, respectively. The extent of improvement in corrosion resistance, alone, is a significant advantage not previously achieved in the prior art.

Example 2

Following the procedure of Example 1, a $Ni_{52}Ti_{48}$ composite structure was formed by rf sputtering alternate layers of Ni and Ti onto a prepared Ni substrate to provide a composite layer thickness of about one micron. The deposited, composite layer was then irradiated with 2.5 MeV Ni+ ions at a concentration of $1 \times 10^{16}/cm^2$ yielding a damage range of about 15-30 dpa.

Figure 4:
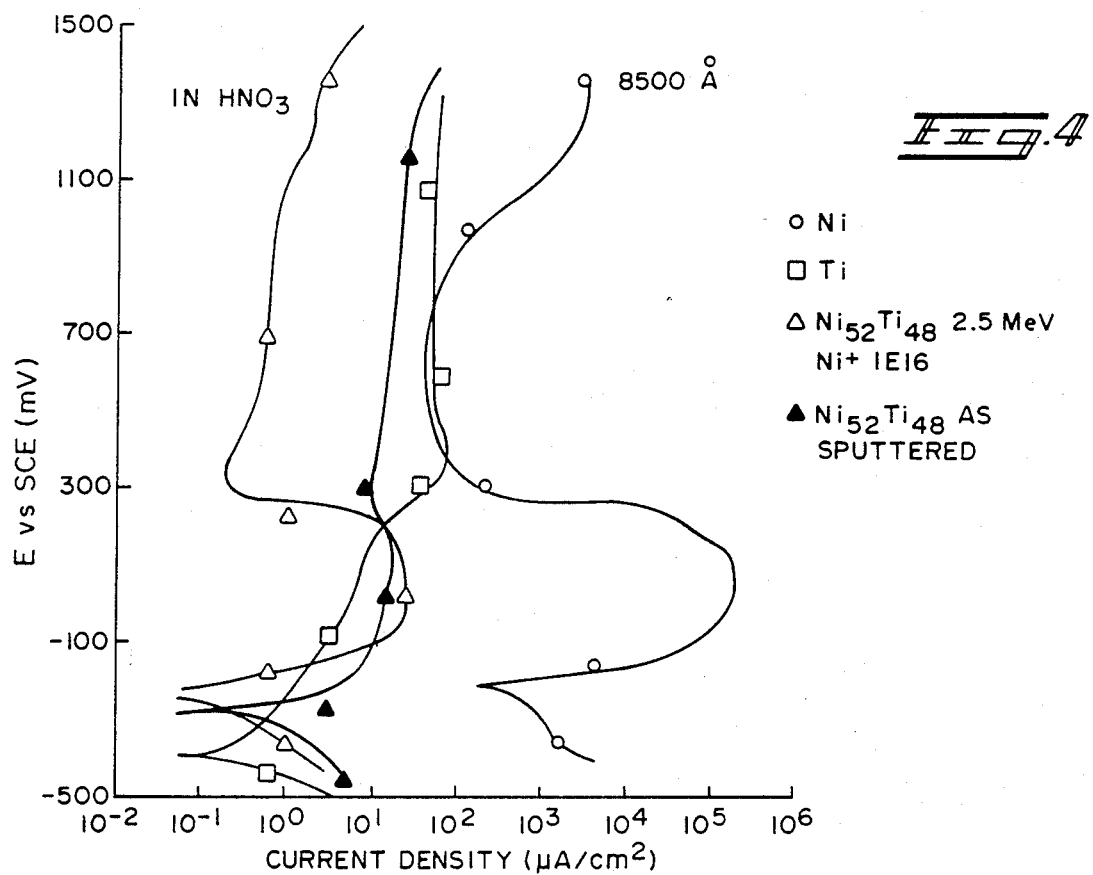
FIG. 4 shows potentiodynamic polarization curves for a 1N $HNO_3$ solution for Ni,Ti, an as sputtered $Ni_{52}Ti_{48}$ coating and an amorphous $Ni_{52}Ti_{48}$ coating sputtered and then irradiated with 2.5 MeV Ni+ to a concentration of $1 \times 10^{16}/cm^2$.
Figure 5:
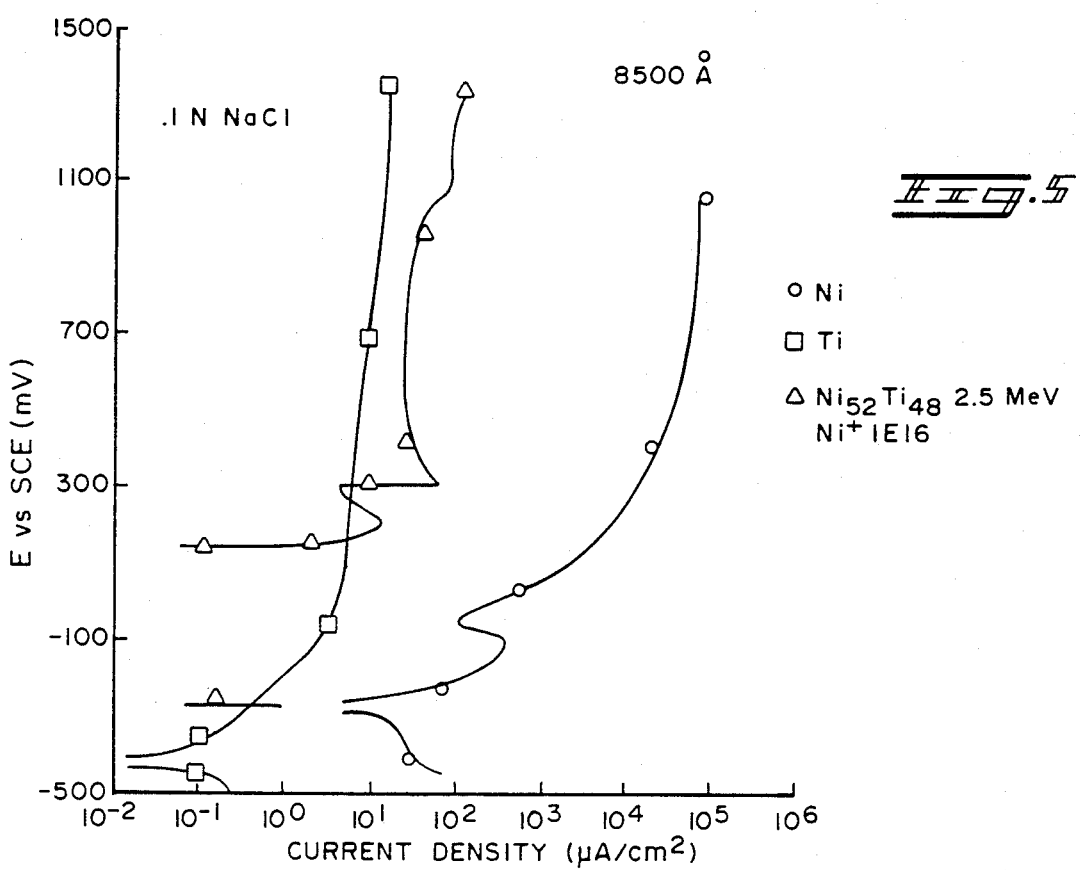
FIG. 5 shows potentiodynamic polarization curves for a 0.1N NaCl solution for Ni, an as sputtered $Ni_{52}Ti_{48}$ layer, and an amorphous $Ni_{52}Ti_{48}$ sputtered layer which has been irradiated with 2.5 MeV Ni+ to a concentration of $1 \times 10^{16}/cm^2$.

Potentiodynamic polarization curves for 1N $HNO_3$ and a 0.1N NaCl solutions for the as deposited $Ni_{52}Ti_{48}$ layer and irradiated $Ni_{52}Ti_{48}$ are shown in FIGS. 4 and 5, respectively. Irradiated $Ni_{52}Ti_{48}$ showed significantly lower critical current density and higher breakdown voltage potential than the as deposited $Ni_{52}Ti_{48}$ in both 1N $HNO_3$ and 0.1N NaCl solutions.

Figure 6:
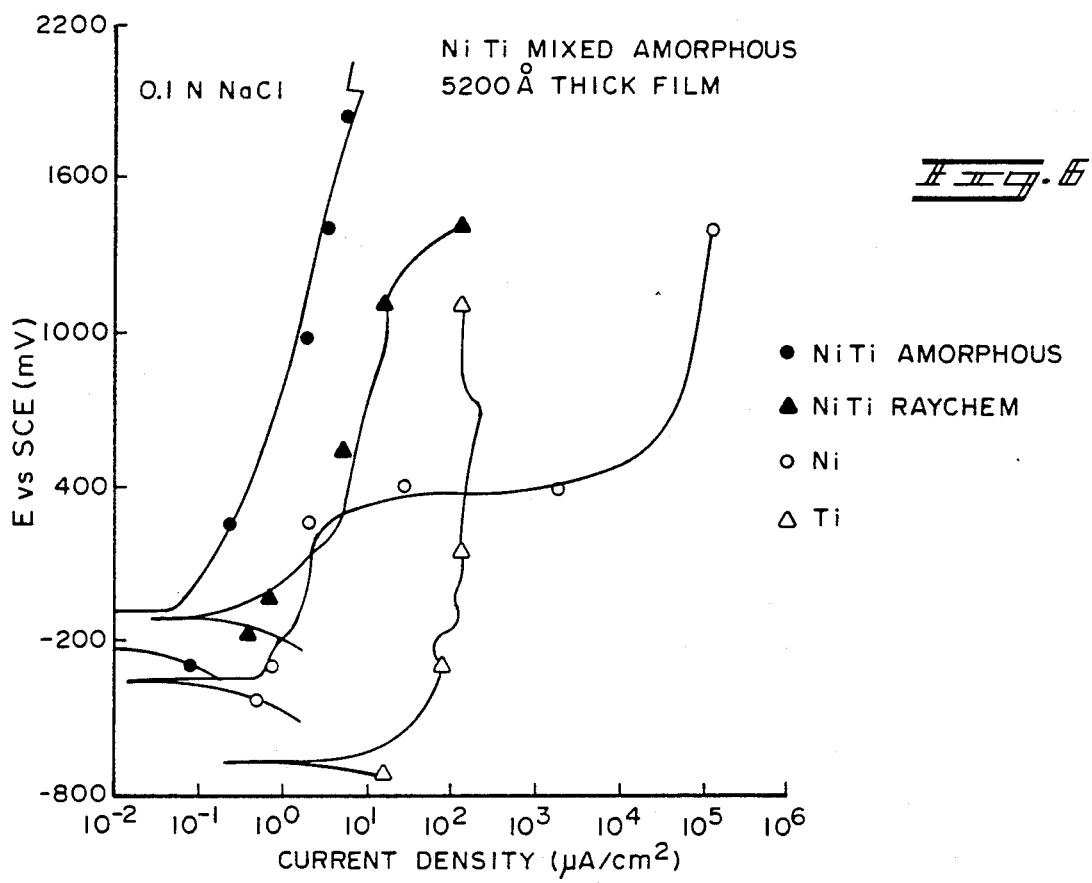
FIG. 6 shows potentiodynamic polarization curves in a 0.1N NaCl solution for Ni, Ti, NiTi (Raychem Corp.) and an amorphous NiTi coating on a Ni substrate.

FIG. 6 shows a potentiodynamic polarization curves comparing the NiTi coatings amorphized with 1.5 MeV Ni+ to a dose of $1 \times 10^{16}/cm^2$ (about 12-25 dpa) with Ni, Ti and NiTi (prepared by Raychem Corp.) specimens in 0.1N NaCl. The superior performance of the amorphized NiTi coating relative to Ni, and even Ti, is readily apparent since the critical current density is about five orders of magnitude less than for Ni in the passivation region.

Example 3

Figure 7:
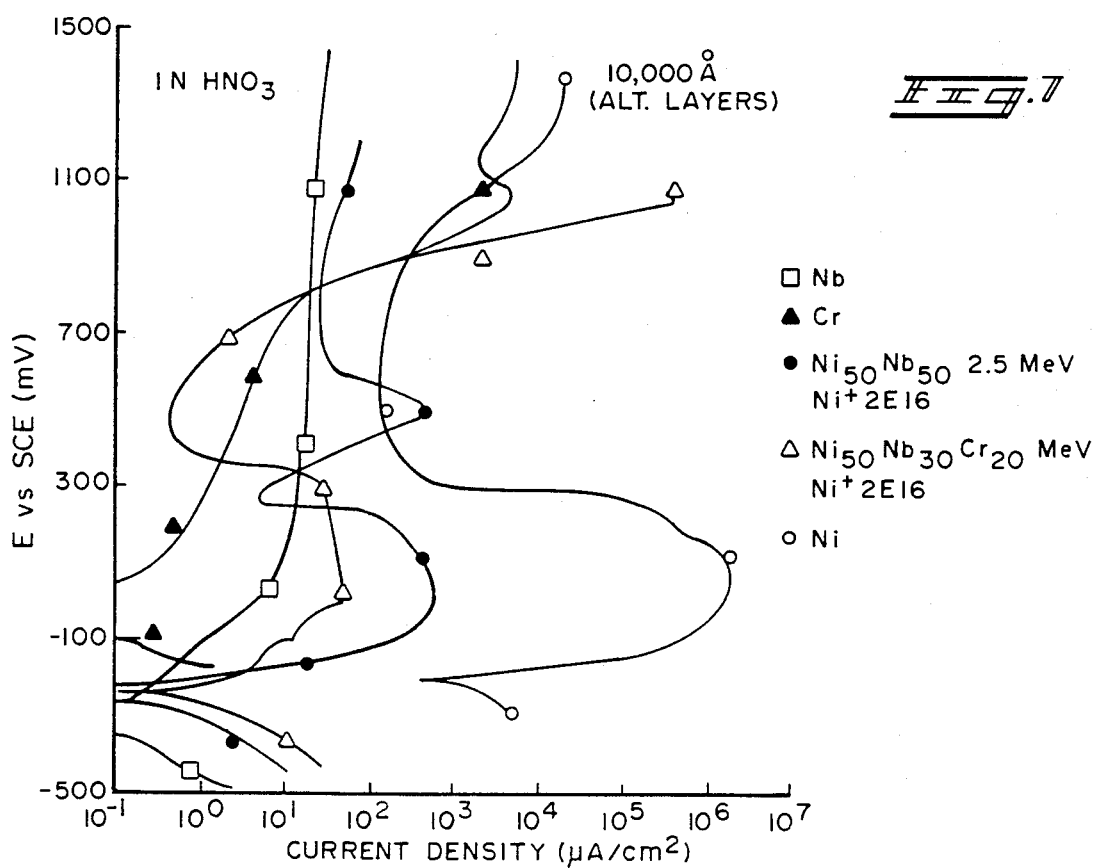
FIG. 7 shows potentiodynamic polarization curves for a 1N $HNO_3$ solution for Ni, an amorphous $Ni_{50}Nb_{50}$ coating and an amorphous $Ni_{50}Nb_{30}Cr_{20}$ coating on a Ni substrate.

Alternate layers of Ni, Nb and Cr were deposited onto a Ni substrate prepared in accordance with Example 1 to provide a composite layer of $Ni_{50}Nb_{30}Cr_{20}$ of about one micron thickness. The resultant composite layer was irradiated with 2.5 MeV Ni+ ions to a concentration of $2 \times 10^{16}/cm^2$, yielding about 30-60 dpa. Potentiodynamic polarization curves for irradiated $Ni_{50}Nb_{30}Cr_{20}$ in 1N $HNO_3$ and 0.1N NaCl are shown in FIGS. 7 and 8, respectively. As shown in FIGS. 7 and 8, irradiated $Ni_{50}Nb_{30}Cr_{20}$ showed significantly lower critical current density, about four orders of magnitude less than the corrosion behavior of Ni.

While preferred embodiments of the present inventions have been illustrated and described, it will be understood that changes and modifications can be made without departing from the inventions in their broader aspects. Various features of the inventions are set forth in the following claims.

What is claimed is:

1. A corrosion resistant nickel containing coating on a metal substrate, said coating having a starting apparent grain size before ion implantation and said coating thoroughly amorphized by accumulating sufficient ion beam implantation damage in excess of about 30-60 displacements per atom to at least enter the stage of relatively sharp decrease of said apparent grain size and the composition of said coating selected from the group consisting essentially of NiNb with Ni of 40 at. %–60 at. %, NiTi with Ni of 40 at. %–60 at. % and the NiNbCr with Ni of 40 at. %–60 at. %, Nb of 10 at. %–30 at. % and Cr the balance.

2. The Ni containing coating as defined in claim 1 wherein the grain sizes of said coating are less than about 100 Angstroms.

3. A corrosion resistant amorphous metallic coating comprising, a combination of transition metal and a refractory metal, said coating having a starting apparent grain size before irradiation and said coating thoroughly amorphized by accumulating sufficient radiation damage in excess of about 30-60 displacements per atom to at least enter the stage of relatively sharp decrease of said apparent grain size and said transition metal selected from the group consisting essentially of Ti, V, Cr, Mn, Fe, Co, Ni and Cu and comprising about 40 at. %–60 at. % of said coating and the balance comprising said refractory metal selected from the group consisting essentially of Zr, Nb, Mo, Ta and W.

4. The coating as defined in claim 3 wherein the apparent grain size of said coating is less than about 100 Angstroms.

5. The coating as defined in claim 3 wherein said radiation damage is introduced by at least one of energetic ions, fast neutrons and high energy photons.

6. A corrosion resistant nickel coating on a metal substrate, said coating thoroughly amorphized by ion beam implantation damage in excess of about 30-60 displacements per atom and also having a balanced and improved corrosion resistance in acidic, baSic and neutral, pH aqueous solutions and the composition of said coating selected from the group consisting essentially of NiNb with Ni of 40 at. %–60 at. %, NiTi with Ni of 40 at. %–60 at. % and NiNbCr with Ni of 40 at. %–60 at. %, Nb of 10 at. %–30 at. % and Cr the balance.

7. A corrosion resistant amorphous metallic coating comprising, a combination of a transition metal and a refractory metal, said coating being thoroughly amorphized by radiation damage in excess of about 30-60 displacements per atom and having a balanced and improved corrosion resistance in acidic, basic and neutral pH aqueous solutions and said transition metal selected from the group consisting essentially of Ni, Ti and Cr and comprising about 40 at. %–60 at. % of said coating and the balance comprising said refractory metal selected from the group consisting essentially of Nb and Mo.

* * * * *